(12) United States Patent
Tanikawa et al.

(10) Patent No.: US 12,077,677 B2
(45) Date of Patent: Sep. 3, 2024

(54) METHOD FOR MANUFACTURING CURED FILM, METHOD FOR MANUFACTURING ELECTRONIC COMPONENT, AND ELECTRONIC COMPONENT

(71) Applicant: SEKISUI CHEMICAL CO., LTD., Osaka (JP)

(72) Inventors: Mitsuru Tanikawa, Osaka (JP); Takashi Watanabe, Osaka (JP); Michihisa Ueda, Osaka (JP); Shigeru Nakamura, Shiga (JP); Hiroshi Maenaka, Osaka (JP); Ryosuke Takahashi, Osaka (JP); Takanori Inoue, Osaka (JP); Yoshito Fujita, Osaka (JP); Osamu Inui, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 16 days.

(21) Appl. No.: 17/548,454

(22) Filed: Dec. 10, 2021

(65) Prior Publication Data
US 2022/0098419 A1    Mar. 31, 2022

Related U.S. Application Data

(63) Continuation of application No. 14/778,859, filed as application No. PCT/JP2014/079320 on Nov. 5, 2014, now Pat. No. 11,220,604.

(30) Foreign Application Priority Data

Nov. 6, 2013 (JP) .................... 2013-230440
Nov. 6, 2013 (JP) .................... 2013-230441
Feb. 18, 2014 (JP) .................... 2014-028379

(51) Int. Cl.
*C09D 4/00*  (2006.01)
*B05D 1/26*  (2006.01)
(Continued)

(52) U.S. Cl.
CPC .............. *C09D 4/00* (2013.01); *B05D 1/26* (2013.01); *B05D 3/061* (2013.01); *B05D 3/067* (2013.01);
(Continued)

(58) Field of Classification Search
CPC .......... B05D 1/26; B05D 3/061; B05D 3/067
See application file for complete search history.

(56) References Cited

U.S. PATENT DOCUMENTS 6,024,433 A * 2/2000 Tsurui ................ B41J 2/16523
347/88
2006/0058412 A1   3/2006 Kakinuma et al.
(Continued)

FOREIGN PATENT DOCUMENTS

CN    103119109 A   5/2013
EP    2 018 969 A1  1/2009
(Continued)

OTHER PUBLICATIONS

International Search Report for the Application No. PCT/JP2014/079320 mailed Feb. 24, 2015.
(Continued)

*Primary Examiner* — Dah-Wei D. Yuan
*Assistant Examiner* — Kristen A Dagenais
(74) *Attorney, Agent, or Firm* — Cheng Law Group, PLLC (57) ABSTRACT

Provided is a method for producing a cured product film, which is capable of increasing the formation accuracy of a fine cured product film and also increasing the adhesion of the cured product film.
The method for producing a curable film according to the present invention includes an application step in which a curable composition that is photocurable and thermocurable and also is in liquid form is applied using an ink jet device,
(Continued)

a first light irradiation step in which the curable composition is irradiated with light from a first light irradiation part, and a heating step in which a precured product film irradiated with light is heated, the ink jet device has an ink tank to store the curable composition, a discharge part, and a circulation flow path part, and in the application step, the curable composition is applied while being circulated in the ink jet device.

17 Claims, 3 Drawing Sheets

(51) Int. Cl.
B05D 3/06 (2006.01)
B41J 3/407 (2006.01)
B41J 11/00 (2006.01)
C09D 11/101 (2014.01)
C09D 11/30 (2014.01)
C09D 11/52 (2014.01)
H05K 3/28 (2006.01)

(52) U.S. Cl.
CPC ............ B41J 3/407 (2013.01); B41J 11/002 (2013.01); B41J 11/0021 (2021.01); B41J 11/00214 (2021.01); C09D 11/101 (2013.01); C09D 11/30 (2013.01); C09D 11/52 (2013.01); H05K 3/287 (2013.01); H05K 2203/013 (2013.01); H05K 2203/0577 (2013.01)

(56) References Cited

U.S. PATENT DOCUMENTS

| | | | |
|---|---|---|---|
| 2006/0061634 A1* | 3/2006 | Hori ................... | B41J 2/14233 347/71 |
| 2006/0139427 A1* | 6/2006 | Makino ................ | C09D 11/36 347/100 |
| 2007/0243387 A1* | 10/2007 | Lin ..................... | C08J 5/12 428/420 |
| 2008/0084463 A1* | 4/2008 | Kawase ............... | B41J 2/17596 347/89 |
| 2009/0027461 A1 | 1/2009 | Asada | |
| 2010/0177148 A1* | 7/2010 | Asami ................. | B41J 2/18 347/85 |
| 2010/0188453 A1* | 7/2010 | Murakami ........... | B41J 2/17596 347/14 |
| 2011/0039117 A1 | 2/2011 | Kadowaki et al. | |
| 2011/0242243 A1 | 10/2011 | Miyabayashi | |
| 2011/0316918 A1 | 12/2011 | Nagashima | |
| 2013/0208064 A1 | 8/2013 | Ueda et al. | |
| 2013/0216726 A1* | 8/2013 | Ueda ................... | C09D 11/101 522/39 |
| 2013/0216776 A1 | 8/2013 | Arnold et al. | |
| 2013/0278668 A1 | 10/2013 | Miyamoto | |
| 2014/0085389 A1 | 3/2014 | Miyabayashi | |
| 2015/0097903 A1 | 4/2015 | Iijima | |
| 2015/0210092 A1 | 7/2015 | Miyabayashi | |
| 2016/0144635 A1 | 5/2016 | Miyabayashi | |
| 2017/0106667 A1 | 4/2017 | Miyabayashi | |
| 2018/0141347 A1 | 5/2018 | Miyabayashi | |

FOREIGN PATENT DOCUMENTS

| | | | |
|---|---|---|---|
| EP | 2 620 479 | A1 | 7/2013 |
| EP | 2 832 803 | A1 | 2/2015 |
| JP | 5-21941 | A | 1/1993 |
| JP | 11-305028 | A | 11/1999 |
| JP | 2004-314346 | A | 11/2004 |
| JP | 2009-29022 | A | 2/2009 |
| JP | 2009-233589 | A | 10/2009 |
| JP | 2010-54777 | A | 3/2010 |
| JP | 2010-247373 | A | 11/2010 |
| JP | 2011-224967 | A | 11/2011 |
| JP | 2012-883 | A | 1/2012 |
| JP | 2012-11585 | A | 1/2012 |
| JP | 2012-21516 | A | 2/2012 |
| JP | 2012-92312 | A | 5/2012 |
| JP | 2012-143691 | A | 8/2012 |
| JP | 2012-148213 | A | 8/2012 |
| JP | 2012-192598 | A | 10/2012 |
| JP | 2013-78862 | A | 5/2013 |
| JP | 2013-124333 | A | 6/2013 |
| JP | 2013-203844 | A | 10/2013 |
| JP | 2013-223944 | A | 10/2013 |
| JP | 5654700 | B1 | 1/2015 |
| KR | 10-2013-0050361 | A | 5/2013 |
| TW | 201004797 | A1 | 2/2010 |
| TW | 201300240 | A1 | 1/2013 |
| WO | WO-2004/099272 | A1 | 11/2004 |
| WO | WO-2012/039372 | A1 | 3/2012 |
| WO | WO-2012/039382 | A1 | 3/2012 |
| WO | WO-2012039372 | A1 * | 3/2012 ............ B41M 3/006 |
| WO | WO-2013/128945 | A1 | 9/2013 |

OTHER PUBLICATIONS

Written Opinion of the International Searching Authority (PCT/ISA/237) for Application No. PCT/JP2014/079320 mailed Feb. 24, 2015 (English Translation mailed Jun. 16, 2016).
Taiwanese Office Action for the Application No. 104133089 dated Dec. 22, 2015.
Korean Office Action for the Application No. 10-2015-7019456 dated Apr. 18, 2016.
Korean Office Action for the Application No. 10-2016-7001225 dated Apr. 18, 2016.
The First Office Action for the Application No. 201480007000.2 from The State Intellectual Property Office of the People's Republic of China dated Apr. 19, 2017.
Supplementary European Search Report for the Application No. EP 14 859 434.4 dated May 2, 2017.
Korean Office Action for Application No. 10-2020-7029519 dated Oct. 30, 2020.

* cited by examiner

METHOD FOR MANUFACTURING CURED FILM, METHOD FOR MANUFACTURING ELECTRONIC COMPONENT, AND ELECTRONIC COMPONENT

CROSS-REFERENCE TO RELATED APPLICATIONS

This application is a Continuation Application of patent application Ser. No. 14/778,859, filed on Sep. 21, 2015, which is a 371 application of Application Serial No. PCT/JP2014/079320, filed on Nov. 5, 2014, which is based on Japanese Patent Application Nos. 2013-230440 and 2013-230441, filed on Nov. 6, 2013, and 2014-028379 filed on Feb. 18, 2014, the entire contents of which are hereby incorporated by reference.

TECHNICAL FIELD

The present invention relates to a method for producing a cured product film, according to which a cured product film is formed using a curable composition that is photocurable and thermocurable. The present invention also relates to a method for producing an electronic component and an electronic component applying the method for producing a cured product film.

BACKGROUND ART

In an electronic device, on an electronic component such as a substrate, other various electronic components are mounted, and the electronic components are electrically connected to each other via electrical wires. In addition, between the electrical wires that electrically connect electronic components, a resist pattern or a partition is formed for the purpose of ensuring insulating properties or allowing for functioning as a protective film.

A resist pattern on a printed wiring board is generally formed using a resist material, which is called photoresist, by photolithography including an exposing step and a developing step.

In the production of a printed wiring board having a resist pattern and a copper circuit, for example, a resist layer is formed on the entire surface of a printed wiring board having a copper circuit, then the resist layer is partially exposed to light through a mask, and the resist layer is partially removed by development. As a result of development, a resist pattern is formed, thereby giving a printed wiring board having a resist pattern and a copper circuit.

An example of such a printed wiring board production method is disclosed in the below-listed Patent Document 1. In Patent Document 1, an exposing step, a developing step, and the like in photolithography are performed.

In addition, another example of a printed wiring board production method is disclosed in the below-listed Patent Document 2. In Patent Document 2, a resist material, which is a photocurable and thermocurable ink-jet composition, is discharged from an ink jet device onto a substrate, and the resist material is cured.

RELATED ART DOCUMENT

Patent Document

Patent Document 1: JP 5-21941 A
Patent Document 2: WO 2004/099272 A1

SUMMARY OF THE INVENTION

Problems to be Solved by the Invention

According to the conventional method for producing a printed wiring board as described in Patent Document 1, the formation of a resist layer requires a large number of steps, including an exposing step, a developing step, and the like in photolithography. Accordingly, the efficiency of printed wiring board production is low.

Further, according to the conventional method for producing a printed wiring board, a chemical liquid such as acid or alkali is used in the development process, resulting in an increased environmental impact. Further, in order to form a resist layer part to be removed by development, it is necessary to use an excess resist material. In addition, the resist layer part removed by development turns into waste. Further, the copper layer removed by etching also turns into waste. Accordingly, the amount of waste is large, resulting in an increased environmental impact. Further, there also is the problem of the increased material cost for a printed wiring board.

In addition, in the method using a conventional ink jet device as described in Patent Document 2, a resist pattern may not be accurately formed. In particular, in the case of forming a fine resist pattern, the formation accuracy tends to be even lower. In addition, in the case of multilayering a resist pattern, the formation accuracy tends to be yet lower.

For example, there will be problems in that a resist pattern cannot be formed in a predetermined shape, the resist pattern is easily separated from the substrate, etc. When the resist pattern is separated from the substrate, insulating properties may not be sufficiently ensured.

An object of the present invention is to provide a method for producing a cured product film, which is capable of increasing the formation accuracy of a fine cured product film and also increasing the adhesion of the cured product film. Another object of the present invention is to provide a method for producing an electronic component and an electronic component applying the method for producing a cured product film.

Means for Solving the Problems

According to a wide aspect of the present invention, provided is a method for producing a cured product film, including: an application step in which a curable composition that is photocurable and thermocurable and also is in liquid form is applied using an ink jet device; a first light irradiation step in which, after the application step, the curable composition is irradiated with light from a first light irradiation part to allow the curing of the curable composition to proceed, thereby forming a precured product film; and a heating step in which, after the first light irradiation step, the precured product film irradiated with light is heated to cure the precured product film irradiated with light, thereby forming a cured product film, the inkjet device including: an ink tank to store the curable composition; a discharge part that is connected to the ink tank and discharges the curable composition; and a circulation flow path part that is connected to the discharge part at one end and connected to the ink tank part at the other end, through which the curable composition flows, the application step being such that, in the ink jet device, the curable composition is moved from the ink tank to the discharge part, and then the curable composition that has not been discharged from the discharge part is moved through the circulation flow path part to the ink tank, whereby the curable composition is applied while being circulated.

In a specific aspect of the method for producing a cured product film according to the present invention, the method for producing a cured product film mentioned above further includes, after the first light irradiation step and before the heating step, a second light irradiation step in which the precured product film irradiated with light from the first light irradiation part is irradiated with light from a second light irradiation part that is different from the first light irradiation part to allow the curing of the precured product film to further proceed.

In a specific aspect of the method for producing a cured product film according to the present invention, the method for producing a cured product film mentioned above further includes, after the first light irradiation step and before the heating step, a multilayering step in which the application step and the first light irradiation step are performed on the precured product film after the first light irradiation step to form an additional precured product film on the precured product film, thereby forming a multilayer precured product film.

In a specific aspect of the method for producing a cured product film according to the present invention, the method for producing a cured product film mentioned above further includes, after the multilayering step and before the heating step, a second light irradiation step in which the multilayer precured product film is irradiated with light from a second light irradiation part that is different from the first light irradiation part to allow the curing of the multilayer precured product film to further proceed.

In a specific aspect of the method for producing a cured product film according to the present invention, the circulation flow path part includes, in the circulation flow path part, a buffer tank to temporarily store the curable composition.

In a specific aspect of the method for producing a cured product film according to the present invention, the application step and the first light irradiation step are performed on the precured product film or between the precured product films after the first light irradiation step.

In a specific aspect of the method for producing a cured product film according to the present invention, the temperature of the curable composition during circulation is 40° C. or more and 100° C. or less.

In a specific aspect of the method for producing a cured product film according to the present invention, the ink jet device is an inkjet device using a piezoelectric inkjet head, and, in the application step, the curable composition is applied by the action of a piezo element.

In a specific aspect of the method for producing a cured product film according to the present invention, the viscosity of the curable composition during discharge is 3 mPa·s or more and 1500 mPa·s or less.

In a specific aspect of the method for producing a cured product film according to the present invention, the curable composition contains a photocurable compound, a thermocurable compound, a photopolymerization initiator, and a thermal curing agent. Ina specific aspect of the method for producing a cured product film according to the present invention, the curable composition contains the photocurable compound, a photo- and thermocurable compound, the thermocurable compound, the photopolymerization initiator, and the thermal curing agent.

In a specific aspect of the method for producing a cured product film according to the present invention, the photocurable compound has a (meth)acryloyl group, the photo- and thermocurable compound has a (meth)acryloyl group and a cyclic ether group, and the thermocurable compound has a cyclic ether group.

In a specific aspect of the method for producing a cured product film according to the present invention, the curable composition contains, as the photocurable compounds, a monofunctional compound having one (meth)acryloyl group and a multifunctional compound having two or more (meth)acryloyl groups.

In a specific aspect of the method for producing a cured product film according to the present invention, the total of the photocurable compound content and the photo- and thermocurable compound content is 40 wt % or more and 90 wt % or less based on 100 wt % of the curable composition.

According to a wide aspect of the present invention, provided is a method for producing an electronic component, including a step of forming a cured product film on an electronic component body by the method for producing a cured product film mentioned above, thereby producing an electronic component including an electronic component body and the cured product film on the electronic component body.

According to a wide aspect of the present invention, provided is an electronic component including an electronic component body and, on the electronic component body, a cured product film obtained by the method for producing a cured product film mentioned above.

Effect of the Invention

In the method for producing a cured product film according to the present invention, an application step in which a curable composition that is photocurable and thermocurable and also is in liquid form is applied using an ink jet device is performed, followed by the first light irradiation step and the heating step. Further, the ink jet device includes the ink tank, the discharge part, and the circulation flow path part. In the application step, in the ink jet device, the curable composition is moved from the ink tank to the discharge part, and then the curable composition that has not been discharged from the discharge part is moved through the circulation flow path part to the ink tank, whereby the curable composition is applied while being circulated. As a result, the formation accuracy of a fine cured product film can be increased, and also the adhesion of the cured product film can be increased.

MODE(S) FOR CARRYING OUT THE INVENTION

Hereinafter, the present invention will be described in detail.

The method for producing a cured product film according to the present invention includes an application step in which a curable composition that is photocurable and thermocurable and also is in liquid form is applied using an ink jet device. The method for producing a cured product film according to the present invention also includes a first light irradiation step in which, after the application step, the curable composition is irradiated with light from a first light irradiation part to allow the curing of the curable composition to proceed, thereby forming a precured product film. The method for producing a cured product film according to the present invention further includes a heating step in which, after the first light irradiation step, the precured product film irradiated with light is heated to cure the precured product film irradiated with light, thereby forming a cured product film.

In addition, in the method for producing a cured product film according to the present invention, the ink jet device includes an ink tank to store the curable composition, a discharge part that is connected to the ink tank and discharges the curable composition, and a circulation flow path part that is connected to the discharge part at one end and connected to the ink tank part at the other end, through which the curable composition flows.

In the method for producing a cured product film according to the present invention, in the application step, in the ink jet device, the curable composition is moved from the ink tank to the discharge part, and then the curable composition that has not been discharged from the discharge part is moved through the circulation flow path part to the ink tank, whereby the curable composition is applied while being circulated.

In the present invention, the above specific application step, the above specific first light irradiation step, and the above specific heating step are performed. Further, using the above specific ink jet device, in the ink jet device, the curable composition is moved from the ink tank to the discharge part, and then the curable composition that has not been discharged from the discharge part is moved through the circulation flow path part to the ink tank, whereby the curable composition is applied while being circulated. As a result, the formation accuracy of a fine cured product film can be increased, and also the adhesion of the cured product film can be increased. For obtaining the effect of the present invention, the application of the curable composition while being circulated is significantly meaningful.

In addition, the method for producing a cured product film according to the present invention preferably includes a multilayering step in which the application step and the first light irradiation step are performed on the precured product film after the first light irradiation step to form an additional precured product film on the precured product film, thereby forming a multilayer precured product film. In the present invention, a thick cured product film can be formed with high accuracy. In addition, in the present invention, even a multilayered cured product film can also be formed finely with high accuracy.

In the case where the multilayering step is included, in the present invention, the above specific application step, the above specific first light irradiation step, the above specific multilayering step, and the above specific heating step are performed. Further, using the above specific ink jet device, in the ink jet device, the curable composition is moved from the ink tank to the discharge part, and then the curable composition that has not been discharged from the discharge part is moved through the circulation flow path part to the ink tank, whereby the curable composition is applied while being circulated. As a result, the formation accuracy of a thick cured product film can be increased, and also the adhesion of the cured product film can be increased. For obtaining the effect of forming a thick cured product film with high accuracy, the application of the curable composition while being circulated is significantly meaningful.

Further, in the present invention, a cured product film having an excellent predetermined shape can be formed without performing a large number of steps, such as an exposing step and a developing step in photolithography. Accordingly, the amount of waste can be reduced, the environmental impact can be reduced, and further the material cost for forming an electronic component can also be reduced.

Hereinafter, the present invention will be clarified with reference to the drawings through the description of specific embodiments and examples of the present invention.

Figure 2:
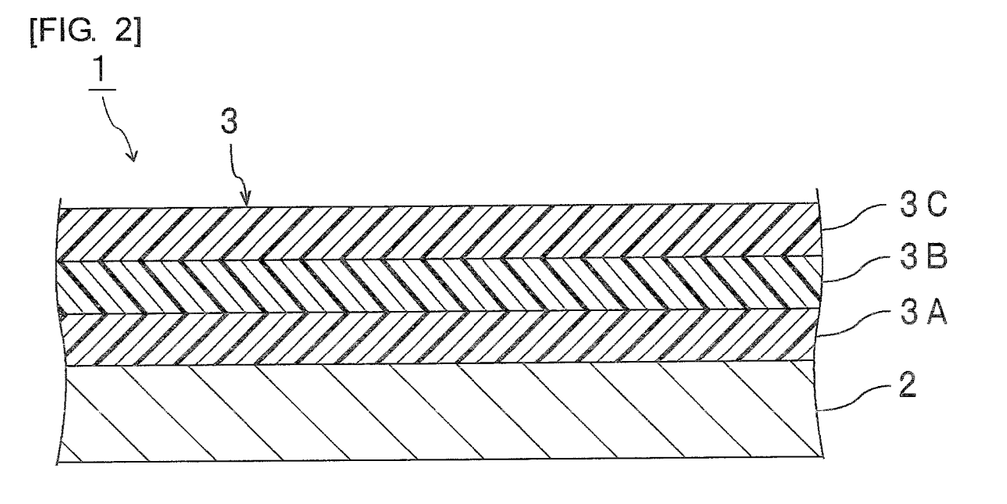
FIG. 2 is a front cross-sectional view schematically showing an electronic component provided with a cured product film obtained by a method for producing a cured product film according to one embodiment of the present invention.

FIG. 2 is a cross-sectional view showing an electronic component provided with a cured product film obtained by a method for producing a cured product film according to one embodiment of the present invention.

The electronic component 1 shown in FIG. 2 is provided with an electronic component body 2 (first electronic component body) and a multilayer cured product film 3 disposed on the surface of the electronic component body 2. The multilayer cured product film 3 has a plurality of cured product films 3A, 3B, and 3C. In the multilayer cured product film 3, the plurality of cured product films 3A, 3B, and 3C are laminated. The multilayer cured product film 3 is a cured product film after heating. It is also possible that a second electronic component body is disposed on the surface opposite to the first electronic component body 2 side of the multilayer cured product film 3.

The electronic component body may be, specifically, a semiconductor chip, a semiconductor wafer after dicing (divided semiconductor wafer), a condenser, a diode, a printed circuit board, a flexible printed circuit board, a glass epoxy substrate, a glass substrate, or the like. The electronic component body may have a cured product film on the surface thereof. In the electronic component body having a cured product film, a cured product film may be formed on the cured product film.

Hereinafter, a method for producing a cured product film according to one embodiment of the present invention will be described.

First, as shown in FIG. 1(a), a curable composition 12 that is photocurable and thermocurable and also is in liquid form is applied onto the electronic component body 2 using an ink jet device 11 (application step). Here, the curable composition 12 is applied onto the entire surface of the electronic component body 2. After the application, droplets of the curable composition 12 mix with each other into the state shown in FIG. 1(b).

Figure 3:
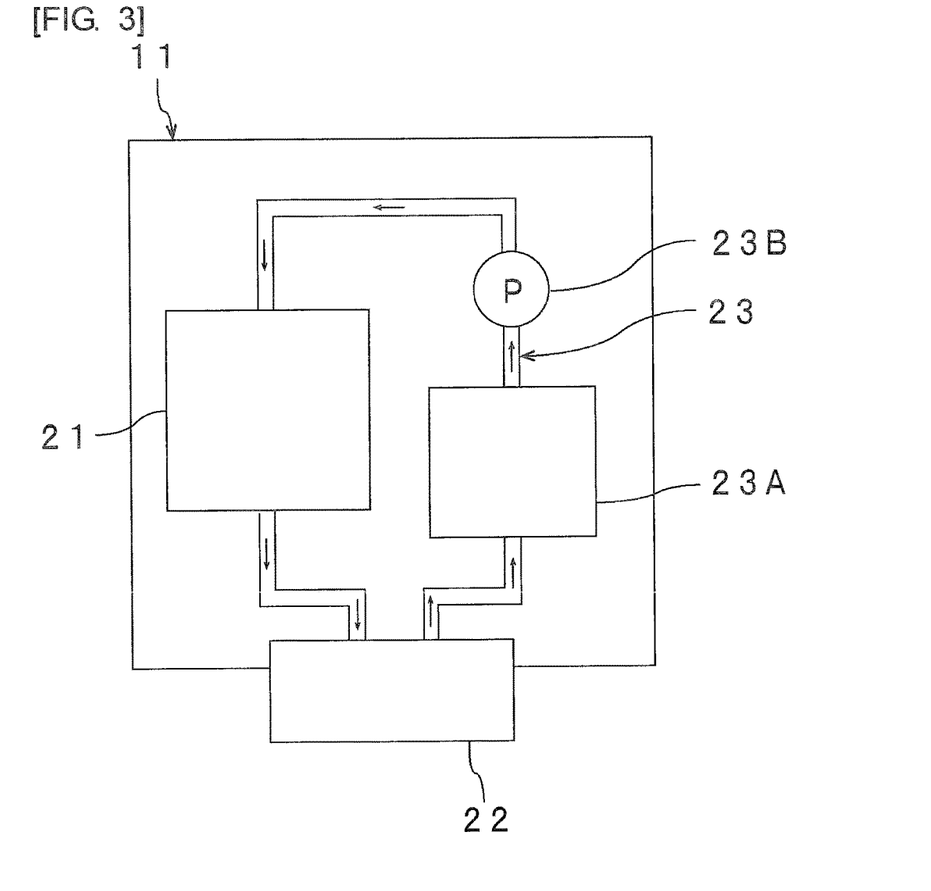
FIG. 3 is a schematic block diagram showing an example of an ink jet device used in a method for producing a cured product film according to one embodiment of the present invention.

As shown in FIG. 3, the ink jet device 11 internally has an ink tank 21, a discharge part 22, and a circulation flow path part 23.

Figure 4:
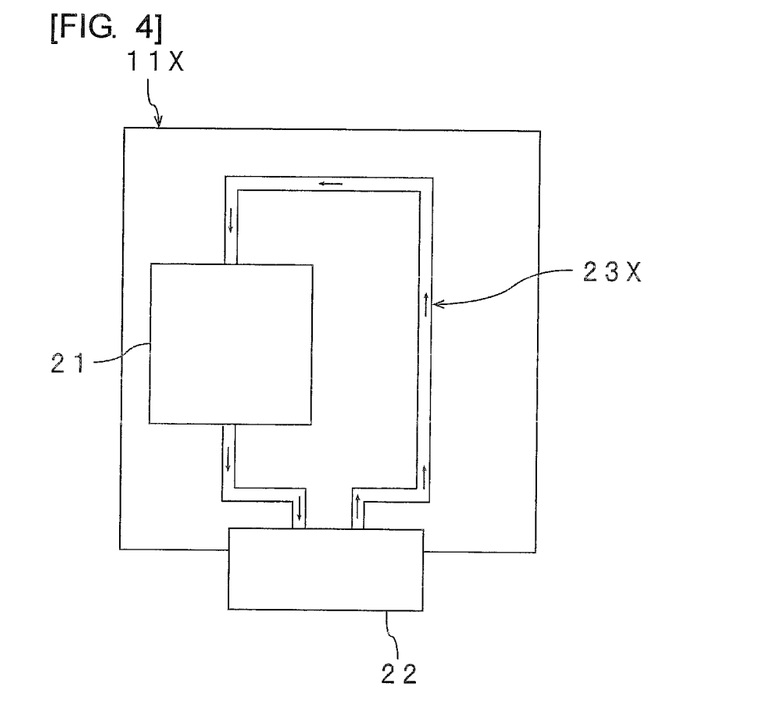
FIG. 4 is a schematic block diagram showing another example of an ink jet device used in a method for producing a cured product film according to one embodiment of the present invention.

The circulation flow path part 23 has a buffer tank 23A and a pump 23B in the circulation flow path part 23. However, like the ink jet device 11X shown in FIG. 4, the circulation flow path part 23X may have no buffer tank or pump in the circulation flow path part 23X. The circulation flow path part preferably has the buffer tank and preferably has the pump in the circulation flow path part. In addition to the buffer tank and the pump, the circulation flow path part may also have a flowmeter, a thermometer, a filter, and the like in the circulation flow path part.

The ink tank 21 stores the curable composition. The curable composition is discharged from the discharge part 22 (ink jet head). The discharge part 22 includes a discharge nozzle. The discharge part 22 is connected to the ink tank 21. The ink tank 21 and the discharge part 22 are connected to each other through a flow path. One end of the circulation flow path part 23 is connected to the discharge part 22, while the other end is connected to the ink tank 21. The curable composition flows through the circulation flow path part 23.

In the case where the buffer tank 23A or the pump 23B is included, it is preferable that the buffer tank 23A and the pump 23B are each disposed between the discharge part 22 and the ink tank 21. The buffer tank 23A is disposed closer to the discharge part 22 than is the pump 23B. The pump 23B is disposed closer to the ink tank 21 than is the buffer tank 23A. The buffer tank 23A temporarily stores the curable composition.

In the application step, in the ink jet device 11, the curable composition is moved from the ink tank 21 to the discharge part 22, and then the curable composition that has not been discharged from the discharge part 22 is passed through the circulation flow path part 23 and moved to the ink tank 21, whereby the curable composition is applied while being circulated in the application step.

The discharge part may be an ink jet head, for example, such as a thermal head, a bubble jet head, a solenoid valve head, or a piezoelectric head. In addition, the circulation flow path part in the discharge part may be an end-shooter type, in which discharge nozzles are branched from a common circulation flow path (manifold), or a side-shooter type, in which an ink circulates through a discharge nozzle. In terms of increasing the dischargeability of the curable composition to further increase the formation accuracy of a fine cured product film, it is preferable that the ink jet device is an ink jet device using a piezoelectric ink jet head, and that, in the application step, the curable composition is applied by the action of a piezo element.

As a method for circulating the curable composition, it is possible to utilize the ink's own weight or perform circulation by pressurization, depressurization, or the like using a pump or the like. It is also possible to use a combination of some of them. The pump may be a cylinder-type nonpulsatile pump, a propeller pump, a gear pump, a diaphragm pump, or the like. In terms of increasing the circulation efficiency to further increase the formation accuracy of a fine cured product film and also further increase the formation accuracy of a thick cured product film, it is preferable that the circulation flow path part includes, in the circulation flow path part, a pump that transfers the curable composition.

In the discharge nozzle of the discharge part, it is preferable that a suitable pressure is maintained, and also that there is not much pressure fluctuation (pulsation) within the range. In the case of using a pump or the like, in order to suppress the pulsation of the pump, it is preferable to provide a damper between the pump and the discharge part. Such a damper may be a buffer tank to temporarily store the curable composition, a membrane-type damper, or the like.

In terms of further increasing the formation accuracy of a fine cured product film and also further increasing the formation accuracy of a thick cured product film, it is preferable that the circulation flow path part includes, in the circulation flow path part, a buffer tank to temporarily store the curable composition.

In the case where the curable composition is circulated with heating, it is possible to introduce a heating heater in the ink tank or use a heating heater in the circulation flow path part, thereby adjusting the temperature of the curable composition.

Figure 1:
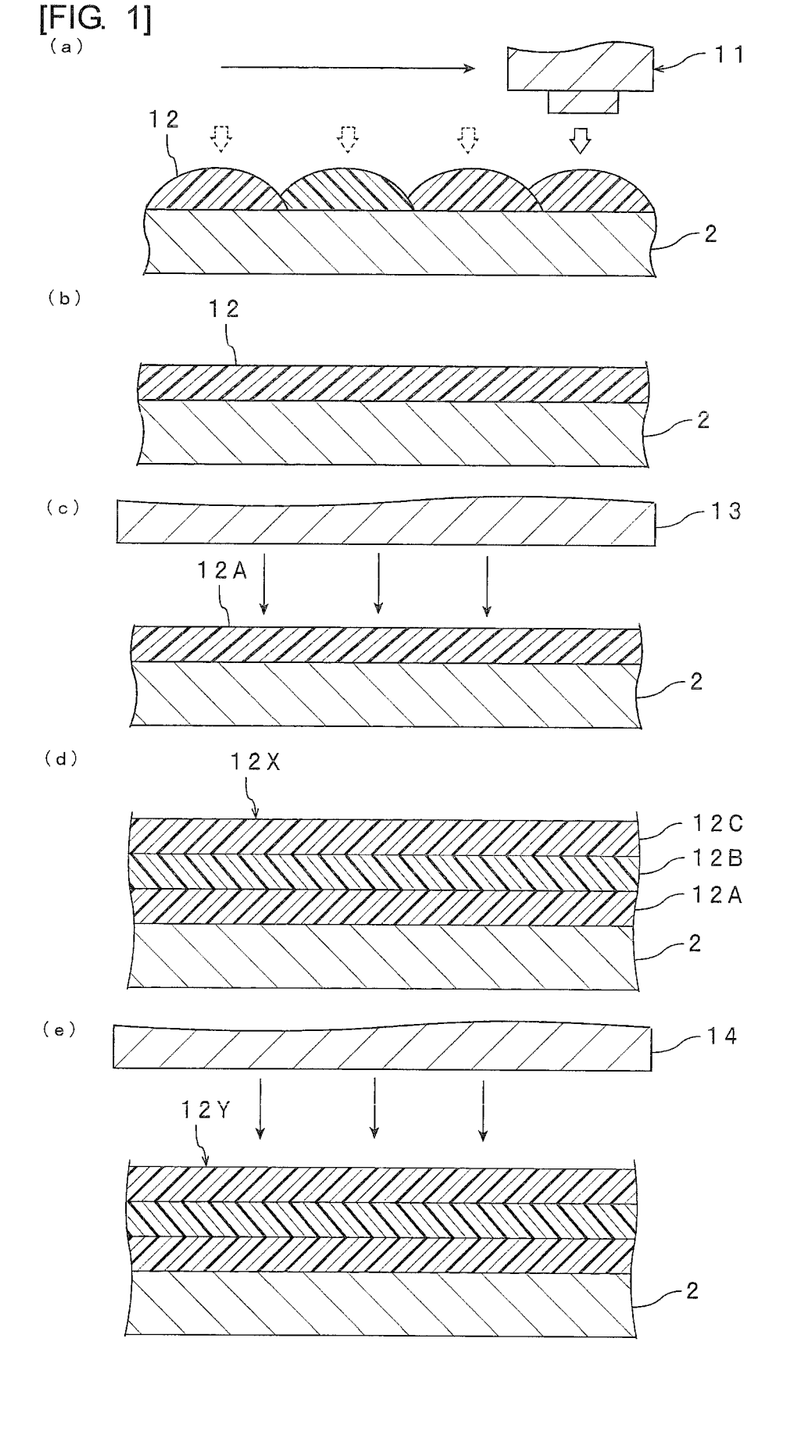
FIGS. 1(a) to (e) are cross-sectional views for explaining each step of a method for producing a cured product film according to one embodiment of the present invention.

Next, as shown in FIGS. 1 (*b*) and (*c*), after the application step, the applied curable composition 12 is irradiated with light from a first light irradiation part 13 to allow the curing of the curable composition 12 to proceed (first light irradiation step). This results in the formation of a precured product film 12A irradiated with light from the first light irradiation part 13. In the case where light is applied from the below-described second light irradiation part 14, the wavelength and irradiation intensity of the light from the first light irradiation part 13 may be the same as or different from the wavelength and irradiation intensity of the light from the below-described second light irradiation part 14. In terms of further increasing the curability of the cured product film, it is preferable that the irradiation intensity of the light from the second light irradiation part 14 is higher than the irradiation intensity of the light from the first light irradiation part 13. In the case of using a photocurable compound and a photo- and thermocurable compound, in order to control photocurability, it is preferable to perform the first light irradiation step and the below-described second light irradiation step.

Incidentally, the description "the applied curable composition 12 is irradiated with light from a first light irradiation part 13 to allow the curing of the curable composition 12 to proceed" also includes that the reaction is allowed to proceed to create a thickened state.

The apparatus for light irradiation is not particularly limited, and may be an ultraviolet light-emitting diode (UV-LED) a metal halide lamp, a high-pressure mercury lamp, an extra-high pressure mercury lamp, or the like. In terms of further increasing the formation accuracy of a cured product film, it is particularly preferable to use a UV-LED as the first light irradiation part.

Next, as shown in FIGS. 1 (*c*) and (*d*) the application step and the first light irradiation step are performed on the precured product film 12A after the first light irradiation step to form additional precured product films 12B and 12C on the precured product film 12A, thereby forming a multilayer precured product film 12X (multilayering step). The multilayer precured product film 12X includes the precured product films 12A, 12B, and 12C. The application step and the first light irradiation step may be performed a plurality of times to increase of the number of laminated layers. Incidentally, the multilayering step does not necessarily have to be performed.

Next, as shown in FIGS. 1 (*d*) and (*e*), after the first light irradiation step and after the multilayering step, the multilayer precured product film 12X (precured product films 12A, 12B, and 12C) is irradiated with light from a second light irradiation part 14 that is different from the first light irradiation part 13 to allow the curing of the multilayer precured product film 12X to further proceed (second light irradiation step). This results in the formation of a precured product film 12Y irradiated with light from the second light irradiation part 14. Incidentally, in the case where the multilayering step is not performed, after the first light irradiation step, the precured product film 12A is irradiated with light from the second light irradiation part 14 that is different from the first light irradiation part 13 to allow the curing of the precured product film 12A to further proceed (second light irradiation step).

It is preferable that the second light irradiation step is performed before the below-described heating step. In terms of further increasing the formation accuracy of a thick cured product film, it is preferable that the second light irradiation step is performed. However, the second light irradiation step does not necessarily have to be performed, and it is also possible that the below-described heating step is performed after the multilayering step without performing the second light irradiation step. Further, it is also possible that the below-described heating step is performed after the first light irradiation step without performing the second light irradiation step.

Next, after the first light irradiation step, after the multilayering step and after the second light irradiation step, the precured product film 12Y is heated to cure the precured product film 12Y irradiated with light from the second light irradiation part 14, thereby forming a cured product film 3 (heating step). Incidentally, in the case where the second light irradiation step is not performed after the multilayering step, it is possible that the multilayer precured product film 12X is heated after the multilayering step to cure the multilayer precured product film 12X, thereby forming a cured product film (heating step). In the case where the multilayering step and the second light irradiation step are not performed after the first light irradiation step, it is possible that the precured product film 12A is heated after the first light irradiation step to cure the precured product film 12A, thereby forming a cured product film (heating step). In this manner, the electronic component 1 shown in FIG. 2 can be obtained.

Figure 5:
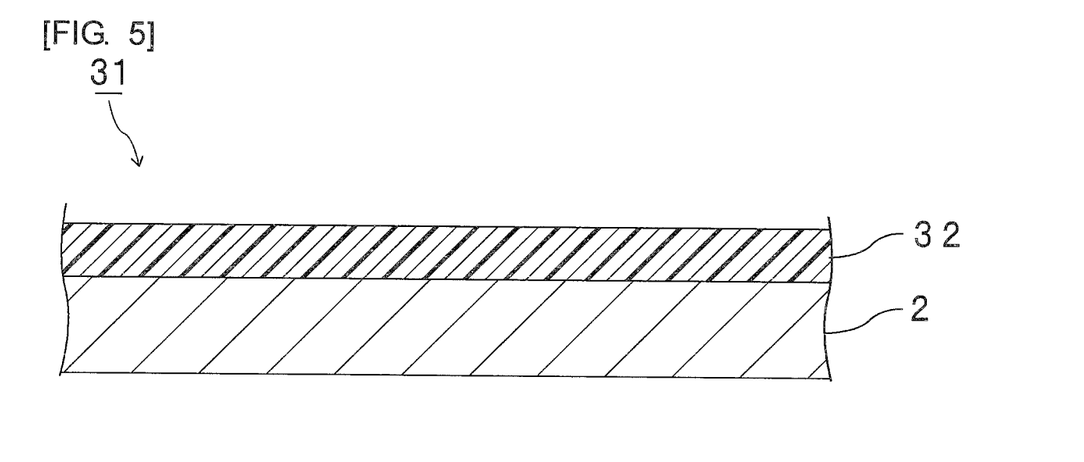
FIG. 5 is a front cross-sectional view schematically showing an electronic component provided with a cured product film obtained by a method for producing a cured product film according to another embodiment of the present invention.

FIG. 5 is a cross-sectional view showing an electronic component provided with a cured product film obtained by a method for producing a cured product film according to another embodiment of the present invention.

The electronic component 31 shown in FIG. 5 is provided with an electronic component body 2 and a cured product film 32 disposed on the surface of the electronic component body 2. The cured product film 32 is monolayer. Like this, it is also possible to form a monolayer cured product film.

In addition, although the application step and the first light irradiation step in the method for producing an electronic component mentioned above are performed on a precured product film to laminate precured product films, it is also possible that the application step and the first light irradiation step are performed between precured product films.

In the method for producing a cured product film mentioned above, in terms of increasing the dischargeability and transportability of the curable composition to further increase the formation accuracy of a fine cured product film and a thick cured product film, it is preferable that the temperature of the curable composition during circulation is 30° C. or more, more preferably 40° C. or more, and 120° C. or less, more preferably 100° C. or less.

In terms of increasing the dischargeability of the curable composition to further increase the formation accuracy of a fine cured product film and a thick cured product film, it is preferable that the viscosity of the curable composition during discharge is 3 mPa·s or more, more preferably 5 mPa·s or more, and 1500 mPa·s or less, more preferably 1200 mPa·s or less.

The viscosity is measured in accordance with JIS K2283 using an E-type viscometer ("TVE22L" manufactured by Toki Sangyo Co., Ltd.) at the temperature during discharge.

The curable composition is photocurable and thermocurable. The curable composition contains a photocurable component and a thermocurable component. It is preferable that the curable composition contains a photocurable compound (curable compound that can be cured by irradiation with light), a thermocurable compound (curable compound that can be cured by heating), a photopolymerization initiator, and a thermal curing agent. It is preferable that the curable composition contains a photocurable compound, a photo- and thermocurable compound (curable compound that can be cured by both irradiation with light and heating), a thermocurable compound, a photopolymerization initiator, and a thermal curing agent. It is preferable that the curable composition contains a curing accelerator.

Incidentally, it is also possible that the curable composition contains a photocurable compound and a thermocurable compound, but does not contain a curable compound that can be cured by both irradiation with light and heating. However, in this case, although the cured product film has increased adhesion, the improving effect on the adhesion of the cured product film tends to be slightly inferior.

Hereinafter, the components contained in the curable composition will be described in detail.

(Curable Compound)
(Photocurable Compound)

Examples of photocurable compounds mentioned above include curable compounds having a (meth)acryloyl group, curable compounds having a vinyl group, and curable compounds having a maleimide group. In terms of further increasing the formation accuracy of a fine cured product film and a thick cured product film, it is preferable that the photocurable compound has a (meth)acryloyl group (at least one). The photocurable compounds may be used alone, and it is also possible to use a combination of two or more kinds.

In this specification, the curable compound having a (meth)acryloyl group mentioned above means a compound having at least either a methacryloyl group or an acryloyl group.

As the photocurable compound, it is possible to use a multifunctional compound (A1) having two or more photoreactive groups or a monofunctional compound (A2) having one photoreactive group.

In terms of further increasing the formation accuracy of a fine cured product film and a thick cured product film, it is preferable that the curable composition contains, as the photocurable compounds, a monofunctional compound (A2) having one (meth)acryloyl group and a multifunctional compound (A1) having two or more (meth)acryloyl groups.

Examples of multifunctional compounds (A1) mentioned above include (meth)acrylic acid adducts of polyalcohols, (meth)acrylic acid adducts of alkylene-oxide-modified polyalcohols, urethane (meth)acrylates, and polyester (meth)acrylates. Examples of polyalcohols mentioned above include diethylene glycol, triethylene glycol, polyethylene glycol, dipropylene glycol, tripropylene glycol, polypropylene glycol, trimethylolpropane, cyclohexane dimethanol, tricyclodecanedimethanol, alkylene oxide adducts of bisphenol A, and pentaerythritol.

Specific examples of multifunctional compounds (A1) mentioned above include tricyclodecanedimethanol di(meth)acrylate, isobornyl dimethanol di(meth)acrylate, and dicyclopentenyl dimethanol di(meth)acrylate. Among them, in terms of further increasing the wet-heat resistance of a cured product, it is preferable that the multifunctional compound (A1) is tricyclodecanedimethanol di(meth)acrylate.

The term "(meth)acrylate" means acrylate or methacrylate. The term "(meth)acryl" means acryl or methacryl.

It is preferable that the multifunctional compound (A1) is a multifunctional compound (A1) that has a polycyclic skeleton and also has two or more (meth)acryloyl groups. Use of a multifunctional compound (A1) makes it possible to increase the wet-heat resistance of a cured product of the curable composition. Accordingly, the reliability of an electronic component can be increased.

The multifunctional compound (A1) is not particularly limited as long as it has a polycyclic skeleton and also has two or more (meth)acryloyl groups. As the multifunctional compound (A1), it is possible to use a known multifunctional compound that has a polycyclic skeleton and also has two or more (meth)acryloyl groups. The multifunctional compound (A1) has two or more (meth)acryloyl groups, and thus is polymerized by irradiation with light and cured. The multifunctional compounds (A1) may be used alone, and it is also possible to use a combination of two or more kinds.

Specific examples of multifunctional compounds (A1) mentioned above include tricyclodecanedimethanol di(meth)acrylate, isobornyl dimethanol di(meth)acrylate, and dicyclopentenyl dimethanol di(meth)acrylate. Among them, in terms of further increasing the wet-heat resistance of a cured product, it is preferable that the multifunctional compound (A1) is tricyclodecanedimethanol di(meth)acrylate.

The "polycyclic skeleton" in the multifunctional compound (A1) or the below-described monofunctional compound (A2) means a structure having a plurality of cyclic skeletons continuously. As the polycyclic skeletons in the multifunctional compound (A1) and the monofunctional compound (A2), a polycyclic alicyclic skeleton and a polycyclic aromatic skeleton can be mentioned, respectively.

Examples of polycyclic alicyclic skeletons mentioned above include a bicycloalkane skeleton, a tricycloalkane skeleton, a tetracycloalkane skeleton, and an isobornyl skeleton.

Examples of polycyclic aromatic skeletons mentioned above include a naphthalene ring skeleton, an anthracene ring skeleton, a phenanthrene ring skeleton, a tetracene ring skeleton, a chrysene ring skeleton, a triphenylene ring skeleton, a tetraphene ring skeleton, a pyrene ring skeleton, a pentacene ring skeleton, a picene ring skeleton, and a perylene ring skeleton.

Specific examples of monofunctional compounds (A2) mentioned above include isobornyl (meth)acrylate, dihydroxycyclopentadienyl (meth)acrylate, dicyclopentenyl (meth)acrylate, dicyclopentenyloxyethyl (meth)acrylate, dicyclopentanyl (meth)acrylate, and naphthyl (meth)acrylate. Among them, in terms of further increasing the wet-heat resistance of a cured product, it is preferable that the monofunctional compound (A2) is at least one member selected from the group consisting of isobornyl (meth) acrylate, dihydroxycyclopentadienyl (meth)acrylate, dicyclopentenyl (meth)acrylate, dicyclopentenyloxyethyl (meth) acrylate, and dicyclopentanyl (meth)acrylate.

Examples of compounds having a vinyl group mentioned above include vinyl ethers, ethylene derivatives, styrene, chloromethyl styrene, α-methylstyrene, maleic anhydride, dicyclopentadiene, N-vinylpyrrolidone, and N-vinylformamide.

The compound having a maleimide group is not particularly limited, and examples thereof include N-methylmaleimide N-ethylmaleimide, N-hexylmaleimide, N-propylmaleimide, N-butylmaleimide, N-octylmaleimide, N-dodecylmaleimide, N-cyclohexylmaleimide, N-phenylmaleimide, N-p-carboxyphenylmaleimide N-p-hydroxyphenylmaleimide, N-p-chlorophenylmaleimide, N-p-tolyimaleimide, N-p-xylylmaleimide, N-o-chlorophenylmaleimide, N-o-tolylmaleimide, N-benzylmaleimide, N-2,5-diethylphenylmaleimide, N-2,5-dimethylphenylmaleimide, N-m-tolylmaleimide, N-α-naphthylmaleimide, N-o-xylylmaleimide, N-m-xylylmaleimide, bismaleimide methane, 1,2-bismaleimide ethane, 1,6-bismaleimide hexane, bismaleimide dodecane, N,N'-m-phenylenedimaleimide, N,N'-p-phenylenedimaleimide, 4,4'-bismaleimide diphenyl ether, 4,4'-bismaleimide diphenylmethane, 4,4'-bismaleimide-di(3-methylphenyl)methane, 4,4'-bismaleimide-di(3-ethylphenyl)methane, 4,4'-bismaleimide-di(3-methyl-5-ethyl-phenyl)methane, N,N'-(2,2-bis-(4-phenoxyphenyl) propane)dimaleimide, N,N'-2,4-tolylene dimaleimide, N,N'-2,6-tolylene dimaleimide, and N,N'-m-xylylenedimaleimide.

In terms of further increasing insulation reliability and adhesion reliability, it is preferable that the photocurable compound has a dicyclopentadiene skeleton.

In terms of further increasing the formation accuracy of a fine cured product film and a thick cured product film, it is preferable that the photocurable compound content based on 100 wt % of the curable composition is 40 wt % or more, more preferably 50 wt % or more, and 90 wt % or less, more preferably 85 wt % or less.

(Photo- and Thermocurable Compound)

Examples of photo- and thermocurable compounds mentioned above include compounds having various kinds of photocurable functional groups and various kinds of thermocurable functional groups. In terms of further increasing the formation accuracy of a fine cured product film and a thick cured product film, the photo- and thermocurable compound preferably has a (meth)acryloyl group and a cyclic ether group, and preferably has a (meth)acryloyl group and an epoxy group. The photo- and thermocurable compounds may be used alone, and it is also possible to use a combination of two or more kinds.

The photo- and thermocurable compound is not particularly limited, and examples thereof include compounds having a (meth)acryloyl group and an epoxy group, partially (meth)acrylated epoxy compounds, and urethane-modified (meth)acrylic epoxy compounds.

Examples of compounds having a (meth)acryloyl group and an epoxy group mentioned above include glycidyl (meth)acrylate and 4-hydroxybutyl (meth)acrylate glycidyl ether.

The partially (meth)acrylated epoxy compound is obtained by the reaction between an epoxy compound and a (meth)acrylic acid in the presence of a catalyst in the usual manner. Examples of epoxy compounds usable for the partially (meth)acrylated epoxy compound include novolac epoxy compounds and bisphenol epoxy compounds. Examples of novolac epoxy compounds mentioned above include phenol novolac epoxy compounds, cresol novolac epoxy compounds, biphenyl novolac epoxy compounds, trisphenol novolac epoxy compounds, and dicyclopentadiene novolac epoxy compounds. Examples of bisphenol epoxy compounds mentioned above include bisphenol A epoxy compounds, bisphenol F epoxy compounds, 2,2'-diallylbisphenol A epoxy compounds, hydrogenated bisphenol epoxy compounds, and polyoxypropylene bisphenol A epoxy compounds. An epoxy compound with a desired acrylation proportion can be obtained by suitably changing the amounts of epoxy compound and (meth)acrylic acid to be blended. It is preferable that the amount of carboxylic acid to be blended per equivalent of epoxy group is 0.1 equivalents or more, more preferably 0.2 equivalents or more, and 0.7 equivalents or less, more preferably 0.5 equivalents or less.

The urethane-modified (meth)acrylic epoxy compound is obtained by the following method, for example. A polyol is allowed to react with a bi- or higher functional isocyanate, and further the remaining isocyanate group is allowed to react with a (meth)acrylic monomer having an acid group and glycidol. Alternatively, without using a polyol, a bi- or higher functional isocyanate may be allowed to react with a (meth)acrylic monomer having a hydroxyl group and glycidol. Alternatively, the urethane-modified (meth)acrylic epoxy compound may also be obtained by allowing a (meth)acrylate monomer having an isocyanate group to react with glycidol. Specifically, for example, first, 1 mol of trimethylolpropane is allowed to react with 3 mol of isophorone diisocyanate in the presence of a tin-based catalyst. The isocyanate group remaining in the obtained compound is allowed to react with hydroxyethyl acrylate, which is an acrylic monomer having a hydroxyl group, and glycidol, which is an epoxy having a hydroxyl group, whereby the urethane-modified (meth)acrylic epoxy compound can be obtained.

The polyol is not particularly limited, and examples thereof include ethylene glycol, glycerin, sorbitol, trimethylolpropane, and (poly)propylene glycol.

The isocyanate is not particularly limited as long as it is bi- or higher functional. Examples of isocyanates mentioned above include isophorone diisocyanate, 2,4-tolylene diisocyanate, 2,6-tolylene diisocyanate, hexamethylene diisocyanate, trimethylhexamethylene diisocyanate, diphenylmethane-4,4'-diisocyanate (MDI), hydrogenated MDI, polymeric MDI, 1,5-naphthalene diisocyanate, norbornane diisocyanate, tolidine diisocyanate, xylylene diisocyanate (XDI), hydrogenated XDI, lysine diisocyanate, triphenylmethane triisocyanate, tris(isocyanatephenyl) thiophosphate, tetramethylxylene diisocyanate, and 1,6,10-undecane triisocyanate.

In terms of further increasing the formation accuracy of a fine cured product film and a thick cured product film, it is preferable that the photo- and thermocurable compound content based on 100 wt % of the curable composition is 0.5 wt % or more, more preferably 1 wt % or more, and 60 wt % or less, more preferably 50 wt % or less.

In terms of further increasing the formation accuracy of a fine cured product film and a thick cured product film, it is preferable that the total of the photocurable compound content and the photo- and thermocurable compound content based on 100 wt % of the curable composition is 40 wt % or more, more preferably 50 wt % or more, and 90 wt % or less, more preferably 85 wt % or less.

(Thermocurable Compound)

Examples of thermocurable compounds mentioned above include thermocurable compounds having a cyclic ether group and thermocurable compounds having a thiirane group. In terms of further increasing the formation accuracy of a fine cured product film and a thick cured product film, the thermocurable compound is preferably a thermocurable compound having a cyclic ether group, and more preferably a thermocurable compound having an epoxy group (epoxy compound). The thermocurable compounds may be used alone, and it is also possible to use a combination of two or more kinds.

The epoxy compound is not particularly limited, and examples thereof include novolac epoxy compounds and bisphenol epoxy compounds. Examples of novolac epoxy compounds mentioned above include phenol novolac epoxy compounds, cresol novolac epoxy compounds, biphenyl novolac epoxy compounds, trisphenol novolac epoxy compounds, and dicyclopentadiene novolac epoxy compounds. Examples of bisphenol epoxy compounds mentioned above include bisphenol A epoxy compounds, bisphenol F epoxy compounds, 2,2'-diallylbisphenol A epoxy compounds, hydrogenated bisphenol epoxy compounds, and polyoxypropylene bisphenol A epoxy compounds. Examples of epoxy compounds mentioned above further include cyclic aliphatic epoxy compounds and glycidylamine.

In terms of further increasing the formation accuracy of a fine cured product film and a thick cured product film, it is preferable that the thermocurable compound content based on 100 wt % of the curable composition is 3 wt % or more, more preferably 5 wt % or more, and 60 wt % or less, more preferably 50 wt % or less.

(Photopolymerization Initiator)

Examples of photopolymerization initiators mentioned above include photo-radical polymerization initiators and photo-cationic polymerization initiators. It is preferable that the photopolymerization initiator is a photo-radical polymerization initiator. The photopolymerization initiators may be used alone, and it is also possible to use a combination of two or more kinds.

The photo-radical polymerization initiator is not particularly limited. The photo-radical polymerization initiator is a compound that generates radicals upon irradiation with light to initiate a radical polymerization reaction. Specific examples of photo-radical polymerization initiators mentioned above include benzoin, benzoin alkylethers, acetophenones, aminoacetophenones, anthraquinones, thioxanthones, ketals, 2,4,5-triarylimidazole dimer, riboflavin tetrabutyrate, thiol compounds, 2,4,6-tris-s-triazine, organic halogen compounds, benzophenones, xanthones, and 2,4,6-trimethylbenzoyl diphenylphosphine oxide. The photo-radical polymerization initiators may be used alone, and it is also possible to use a combination of two or more kinds.

Together with the photo-radical polymerization initiator, a photopolymerization initiation aid may also be used. Examples of photopolymerization initiation aids mentioned above include N,N-dimethylaminobenzoic acid ethyl ester, N,N-dimethylaminobenzoic acid isoamyl ester, pentyl-4-dimethylamino benzoate, triethylamine, and triethanolamine. Other photopolymerization initiation aids may also be used. The photopolymerization initiation aids may be used alone, and it is also possible to use a combination of two or more kinds.

In addition, a titanocene compound having absorption in the visible light region, such as CGI-784 (manufactured by Ciba Specialty Chemicals), may also be used to promote the photoreaction.

The photo-cationic polymerization initiator is not particularly limited, and examples thereof include sulfonium salts, iodonium salts, metallocene compounds, and benzoin tosylate. The photo-cationic polymerization initiators may be used alone, and it is also possible to use a combination of two or more kinds.

It is preferable that the photopolymerization initiator content based on 100 wt % of the curable composition is 0.1 wt % or more, more preferably 0.2 wt % or more, and 10 wt % or less, more preferably 5 wt % or less.

(Thermal Curing Agent)

Examples of thermal curing agents mentioned above include organic acids, amine compounds, amide compounds, hydrazide compounds, imidazole compounds, imidazoline compounds, phenolic compounds, urea compounds, polysulfide compounds, and acid anhydrides. It is also possible to use a modified polyamine compound, such as an amine-epoxy adduct, as the thermal curing agent. Other thermal curing agents may also be used. The thermal curing agents may be used alone, and it is also possible to use a combination of two or more kinds.

The amine compound means a compound having at least one primary to tertiary amino group. Examples of amine compounds mentioned above include (1) aliphatic polyamines, (2) alicyclic polyamines, (3) aromatic polyamines, (4) hydrazides, and (5) guanidine derivatives. In addition, it is also possible to use adducts, such as an epoxy-compound-added polyamine (reaction product between an epoxy compound and a polyamine), a Michael-added polyamine (reaction product between α,β(3-unsaturated ketone and a polyamine), a Mannich-added polyamine (condensate of a polyamine, formalin, and phenol), a thiourea-added polyamine (reaction product between thiourea and a polyamine), and a ketone-blocked polyamine (reaction product between a ketone compound and a polyamine [ketimine]).

Examples of (1) aliphatic polyamines mentioned above include diethylenetriamine, triethylenetetramine, tetraethylenepentamine, and diethylamino propylamine.

Examples of (2) alicyclic polyamines mentioned above include menthanediamine, isophoronediamine, N-aminoethylpiperazine, 3,9-bis(3-aminopropyl)-2,4,8,10-tetraoxaspiro(5,5)undecane adduct, bis(4-amino-3-methylcyclohexyl)methane, and bis(4-aminocyclohexyl)methane.

Examples of (3) aromatic polyamines mentioned above include m-phenylenediamine, p-phenylenediamine, o-xylenediamine, m-xylenediamine, p-xylenediamine, 4,4-diaminodiphenylmethane, 4,4-diaminodiphenylpropane, 4,4-diaminodiphenylsulfone, 4,4-diaminodicyclohexane, bis(4-aminophenyl)phenylmethane, 1,5-diaminonaphthalene, 1,1-bis(4-aminophenyl)cyclohexane, 2,2-bis[(4-aminophenoxy)phenyl]propane, bis[4-(4-aminophenoxy)phenyl]sulfone, 1,3-bis(4-aminophenoxy)benzene, 4,4-methylene-bis(2-chloroaniline), and 4,4-diaminodiphenylsulfone.

Examples of (4) hydrazides mentioned above include carbodihydrazide, adipic acid dihydrazide, sebacic acid dihydrazide, dodecanedioic acid dihydrazide, and isophthalic acid dihydrazide.

Examples of (5) guanidine derivatives mentioned above include dicyandiamide, 1-o-tolyldiguanide, α-2,5-dimethylguanide, α,ω-diphenyldiguanide, α,α-bisguanyl guanidino diphenyl ether, p-chlorophenyldiguanide, α,α-hexamethylene bis[ω-(p-chlorophenol)]diguanide, phenyldiguanide oxalate, acetylguanidine, and diethylcyanoacetylguanidine.

Examples of phenolic compounds mentioned above include polyphenol compounds. Examples of polyphenol compounds mentioned above include phenol, cresol, ethylphenol, butylphenol, octylphenol, bisphenol A, tetrabromobisphenol A, bisphenol F, bisphenol S, 4,4'-biphenylphenol, a phenol novolac resin having a naphthalene skeleton, a phenol novolac resin having a xylylene skeleton, a phenol novolac resin having a dicyclopentadiene skeleton, and a phenol novolac resin having a fluorene skeleton.

Examples of acid anhydrides mentioned above include phthalic anhydride, tetrahydrophthalic anhydride, hexahydrophthalic anhydride, methyltetrahydrophthalic anhydride, methylnadic anhydride, dodecylsuccinic anhydride, chlorendic anhydride, pyromellitic dianhydride, benzophenone tetracarboxylic anhydride, methylcyclohexene tetracarboxylic anhydride, trimellitic anhydride, and polyazelaic anhydride.

It is preferable that the thermal curing agent content based on 100 wt % of the curable composition is 1 wt % or more, more preferably 5 wt % or more, and 60 wt % or less, more preferably 50 wt % or less.

(Curing Accelerator)

Examples of curing accelerators mentioned above include tertiary amine, imidazole, quaternary ammonium salts, quaternary phosphonium salts, organic metal salts, phosphorus compounds, and urea compounds.

It is preferable that the curing accelerator content based on 100 wt % of the curable composition is 0.01 wt % or more, more preferably 0.1 wt % or more, and 10 wt % or less, more preferably 5 wt % or less.

(Other Components)

The curable composition may also contain other components. Examples of other components include, but are not particularly limited to, adhesion aids such as coupling agents, pigments, dyes, leveling agents, defoaming agents, and polymerization inhibitors.

Hereinafter, the present invention will be described in detail with reference to examples and comparative examples. The present invention is not limited to the following examples.

(Examples and Comparative Examples without Multilayering Step)

(Preparation of Curable Composition A)

Sixty parts by weight of trimethylolpropane triacrylate (TMPTA, manufactured by Daicel-Allnex Ltd.) as a photocurable compound, 10 parts by weight of an acrylic acid adduct of a bisphenol A epoxy resin (UVACURE1561, manufactured by Daicel-Allnex Ltd.) as a photo- and thermocurable compound, 30 parts by weight of a bisphenol A epoxy compound (EXA850CRP, manufactured by DIC Corporation) as a thermocurable compound, 30 parts by weight of a terpene-based acid anhydride compound (YH 309, manufactured by Mitsubishi Chemical Corporation) as a thermal curing agent, 1 part by weight of a DBU-octylic acid salt (UCAT SA102, manufactured by San-Apro Ltd.) as a curing accelerator, and 5 parts by weight of 2-benzyl-2-dimethylamino-4-morpholinobutyrophenone (IRUGACURE369, manufactured by BASF) as a photopolymerization initiator were uniformly mixed to give a curable composition A.

At the circulation temperature during the below-described film formation and fine pattern formation (the temperature during discharge), the viscosity of the obtained curable composition A at 10 rpm was measured using a viscometer ("TVE22L" manufactured by Toki Sangyo Co., Ltd.).

(Preparation of Curable Compositions B to G)

Preparation was performed in the same manner as in the preparation of the curable composition A, except that the components shown in the following Table 1 were blended in the blending amounts shown in the following Table 2. The viscosity of the obtained curable compositions B to G was also measured in the same manner as for the viscosity of the curable composition A at the circulation temperature during the below-described film formation and fine pattern formation (the temperature during discharge)

TABLE 1

| | | | |
|---|---|---|---|
| Photocurable compound | TMPTA | Trimethylolpropane triacrylate | Manufactured by Daicel-Allnex Ltd. |
| | IRR-214K | Tricyclodecanedimethanol diacrylate | Manufactured by Daicel-Allnex Ltd. |
| Photo - and thermocurable compound | UVACURE 1561 | Acrylic acid adduct of bisphenol A epoxy resin | Manufactured by Daicel-Allnex Ltd. |
| | GMA | Glycidyl methacrylate | Manufactured by NOF Corporation |
| Thermocurable compound | EXA850CRP | Bisphenol A epoxy compound | Manufactured by DIC Corporation |
| | YDF-170 | Bisphenol F epoxy compound | Manufactured by Nippon Steel & Sumikin Chemical Co., Ltd. |
| | PETG | Aliphatic epoxy compound | Manufactured by Showa Denko K.K. |
| Photopolymerization initiator | IRUGACURE369 | 2-Benzyl-2-dimethylamino-4-morpholinobutyrophenone | Manufactured by BASF |
| Thermal curing agent | YH309 | Terpene-based acid anhydride compound | Manufactured by Mitsubishi Chemical Corporation |
| Curing accelerator | UCAT SA102 | DBU-octylic acid salt | Manufactured by San-Apro Ltd. |

TABLE 2

| | | Curable composition A | Curable composition B | Curable composition C | Curable composition D | Curable composition E | Curable composition F | Curable composition G |
|---|---|---|---|---|---|---|---|---|
| Photocurable compound | TMPTA | 60 | 70 | 65 | 70 | 60 | | 50 |
| | IRR-214K | | | | | 30 | | 50 |
| Photo- and thermocurable compound | UVACURE 1561 | 10 | | 10 | 10 | 5 | | |
| | GMA | | | 5 | | | | |
| Thermocurable compound | EXA850CRP | 30 | 30 | 20 | | 5 | 30 | |
| | YDF-170 | | | | 20 | | 50 | |
| | PETG | | | | | | 20 | |
| Photopolymerization initiator | IRUGAGURE369 | 5 | 5 | 5 | 5 | 5 | | 5 |
| Thermal curing agent | YH309 | 30 | 30 | 30 | 25 | 5 | 100 | |
| Curing accelerator | UCAT SA102 | 1 | 1 | 1 | 1 | 1 | 1 | 1 |

Example 1

(1) Film Formation

A catalyst ("Catalyst 44" manufactured by Rohm and Haas) and a copper plating liquid ("CUPOSIT 253" manufactured by Rohm and Haas) were disposed on an FR-4 substrate ("R-1705" manufactured by Panasonic Corporation (0.8 mm thick)), and a copper plating layer to serve as copper wiring was partially formed to give a substrate (copper clad laminate).

In accordance with the method for producing an electronic component according to one embodiment of the present invention mentioned above, the steps shown in FIGS. 1(a) to (e) were performed (however, the conditions were set as shown below in Table 3) to form a cured product film. The application step, in which the curable composition A was applied while being circulated, and the first light irradiation step were performed once, and the heating step was performed to form a cured product film, thereby giving a printed wiring board, which is an electronic component. In the application step, the curable composition was applied while being circulated. The application pattern was made to give a 5 cm×5 cm flat film, and 20 films were formed.

(2) Fine Pattern Formation

A catalyst ("Catalyst 44" manufactured by Rohm and Haas) and a copper plating liquid ("CUPOSIT 253" manufactured by Rohm and Haas) were disposed on an FR-4 substrate ("R-1705" manufactured by Panasonic Corporation (0.8 mm thick)), and a copper plating layer to serve as copper wiring was partially formed to give a substrate (copper clad laminate).

In accordance with the method for producing an electronic component according to one embodiment of the present invention mentioned above, the steps shown in FIGS. 1 (a) to (e) were performed (however, the conditions were set as shown below in Table 3) to form a cured product film. The application step, in which the curable composition A was applied while being circulated, and the first light irradiation step were performed once, and the heating step was performed to form a cured product film, thereby giving a printed wiring board, which is an electronic component. In the application step, the curable composition was applied while being circulated. Application was performed in such an application pattern that the line width was 80 μm and the interval between lines was 80

Examples 2 to 10 and Comparative Examples 1 to 4

Film formation and fine pattern formation were performed in the same manner as in Example 1, except that the kind of curable composition and the production conditions were changed as shown below in Table 3.

(Evaluation)

(1) Evaluation of Substrate after Film Formation (Examination of Discharge Failure)

The films were examined under a stereoscopic microscope ("SMZ-10" manufactured by Nikon Corporation) to examine the escape of liquid.

[Criteria for Film Formation]
○: 0/20 pattern had failure.
Δ: 1 or more and 4 or less/20 patterns had failure.
X: 5 or more/20 patterns had failure.

(2) Evaluation of Substrate after Fine Pattern Formation

Using an optical microscope (Digital microscope VH-2100, manufactured by Keyence Corp.), the lines and the interval between lines were measured at 30 points (excluding regions having discharge failure).

(3) Evaluation of Adhesion of Cured Product Film on Substrate after Film Formation (Long-Term Reliability: Hot-Cold Cycle Evaluation)

Using a liquid-bath-type thermal shock tester ("TSB-51" manufactured by ESPEC Corporation), the substrates after film formation were subjected to a hot-cold cycle test, in which one cycle includes holding at −50° C. for 5 minutes, then heating to 125° C., holding at 125° C. for 5 minutes, and then cooling to −50° C. The substrates were taken out after 500 cycles.

The substrates were observed under a stereoscopic microscope ("SMZ-10" manufactured by Nikon Corporation) to examine separation.

[Criteria for Adhesion]
○: No separation
Δ: Slight separation (not problematic in use)
X: Significant separation (problematic in use)

The results are shown in the following Table 3.

TABLE 3

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| Curable composition | A | A | A | A | A | A | B | C |
| Viscosity (mPa · s) | 22 | 22 | 22 | 460 | 280 | 9 | 41 | 28 |
| Ink jet head | | | | Piezoelectric head | | | | |
| Circulation temperature*1 | 80° C. | 80° C. | 80° C. | 30° C. | 40° C. | 110° C. | 80° C. | 80° C. |
| Circulation velocity*2 | 30 ml/min | 30 ml/min | 30 ml/min | 30 ml/min | 30 ml/min | 30 ml/min | 30 ml/min | 30 ml/min |
| Buffer tank | Present | Present | Absent | Present | Present | Present | Present | Present |
| First light irradiation (mJ/cm$^2$)*3 | 50 | 50 | 50 | 50 | 50 | 50 | 50 | 50 |
| Second light irradiation (mJ/cm$^2$)*4 | Absent | 200 | 200 | 200 | 200 | 200 | 200 | 200 |
| Heating | | | | 170° C. × 3 hr | | | | |
| (1) Film formation | ○ | ○ | ○ | ○ | ○ | ○ | ○ | ○ |
| (2) Fine pattern formation | ○ | ○○ | ○ | ○ | ○○ | ○ | ○○ | ○○ |
| (3) Adhesion | ○ | ○ | ○ | ○ | ○ | ○ | Δ | ○ |

|  | Ex. 9 | Ex. 10 | Comp. Ex. 1 | Comp. Ex. 2 | Comp. Ex. 3 | Comp. Ex. 4 |
|---|---|---|---|---|---|---|
| Curable composition | D | E | A | A | F | G |
| Viscosity (mPa · s) | 15 | 10 | 22 | 22 | 250 | 7 |
| Ink jet head | | | Piezoelectric head | | | |
| Circulation temperature*1 | 80° C. | 80° C. | 80° C.*5 | 80° C.*5 | 80° C. | 80° C. |
| Circulation velocity*2 | 30 ml/min | 30 ml/min | Not circulated | Not circulated | 30 ml/min | 30 ml/min |
| Buffer tank | Present | Present | Absent | Absent | Present | Present |
| First light irradiation (mJ/cm$^2$)*3 | 50 | 50 | 50 | 50 | Absent | 50 |
| Second light irradiation (mJ/cm$^2$)*4 | 200 | 200 | Absent | 200 | Absent | 200 |
| Heating | | | 170° C. × 3 hr | | | Absent |
| (1) Film formation | ○ | ○ | X | X | ○ | ○ |
| (2) Fine pattern formation | ○○ | ○○ | X | Δ | XX | ○○ |
| (3) Adhesion | ○ | ○ | ○ | ○ | ○ | X |

*1Heated using a heating heater placed in the ink tank
*2Circulated using a pump
*3Irradiated using a UV-LED having an irradiation intensity of 50 mW/cm$^2$ at 365 nm
*4Irradiated using an ultrahigh-pressure mercury lamp having an irradiation intensity of 100 mW/cm$^2$ at 365 nm
*5Heated only at the head part

[Criteria for Fine Pattern Formation]
○○: Linewidth is 80±5 μm.
○: Linewidth does not fall under ○○ and is 80±10 μm.
Δ: Linewidth does not fall under ○○ or ○ and is 80±20 μm.
X: Linewidth does not fall under ○○, ○, or Δ and is 80±30 μm.
XX: There is no interval between lines, or linewidth is more than 80±30 μm.

(Examples and Comparative Examples with Multilayering Step)

Synthesis Example 1

Fifty gram of methyl cellosolve, 15 g of dicyandiamide, and 1 g of 2,4-diamino-6-[2'-undecylimidazolyl-(1')]-ethyl-s-triazine were added to a three-neck separable flask provided with a stirrer, a thermometer, and a dropping funnel, and heated to 100° C. to dissolve dicyandiamide. After dissolution, 130 g of butyl glycidyl ether was added dropwise thereto over 20 minutes from the dropping funnel and allowed to react for 1 hour. The temperature was then lowered to 60° C., and the pressure was reduced to remove the solvent, thereby giving a faint yellow, viscous reaction product (thermal curing agent A).

(Preparation of Curable Composition A)

Thirty parts by weight of trimethylolpropane triacrylate (TMPTA, manufactured by Daicel-Allnex Ltd.) as a photocurable compound, 30 parts by weight of tricyclodecanedimethanol diacrylate (IRR-214K, manufactured by Daicel-Allnex Ltd.) as a photocurable compound, 10 parts by weight of an acrylic acid adduct of a bisphenol A epoxy compound (UVACURE1561, manufactured by Daicel-Allnex Ltd.) as a photo- and thermocurable compound, 30 parts by weight of a bisphenol A epoxy compound (EXA850CRP, manufactured by DIC Corporation) as a thermocurable compound, 7.5 parts by weight of the thermal curing agent A (synthesized in Synthesis Example 1) as a thermal curing agent, 1 part by weight of a DBU-octylic acid salt (UCAT SA102, manufactured by San-Apro Ltd.) as a curing accelerator, and 5 parts by weight of 2-benzyl-2-dimethylamino-4-morpholinobutyro-phenone (IRUGACURE369, manufactured by BASF) as a photopolymerization initiator were uniformly mixed to give a curable composition A.

At the circulation temperature during the below-described film formation and fine pattern formation (the temperature during discharge), the viscosity of the obtained curable composition A at 10 rpm was measured using a viscometer ("TVE22L" manufactured by Toki Sangyo Co., Ltd.).

(Preparation of Curable Compositions B to H)

Preparation was performed in the same manner as in the preparation of the curable composition A, except that the components shown in the following Table 4 were blended in the blending amounts shown in the following Table 5. The viscosity of the obtained curable compositions B to H was also measured in the same manner as for the viscosity of the curable composition A.

TABLE 4

| | | | |
|---|---|---|---|
| Photocurable compound | TMPTA | Trimethylolpropane triacrylate | Manufactured by Daicel-Allnex Ltd. |
| | IRR-214K | Tricyclodecanedimethanol diacrylate | Manufactured by Daicel-Allnex Ltd. |
| Photo - and thermocurable compound | UVACURE 1561 | Acrylic acid adduct of bisphenol A epoxy resin | Manufactured by Daicel-Allnex Ltd. |
| | GMA | Glycidyl methacrylate | Manufactured by NOF Corporation |
| Thermocurable compound | EXA850CRP | Bisphenol A epoxy compound | Manufactured by DIC Corporation |
| | YDF-170 | Bisphenol F epoxy compound | Manufactured by Nippon Steel & Sumikin Chemical Co., Ltd. |
| | PETG | Aliphatic epoxy compound | Manufactured by Showa Denko K.K. |
| Photopolymerization initiator | IRUGACURE369 | 2-Benzyl-2-dimethylamino-4-morpholinobutyrophenone | Manufactured by BASF |
| Thermal curing agent | Thermal curing agent A | Thermal curing agent obtained in Synthesis Example 1 | Manufactured by Sekisui Chemical Co., Ltd. |
| Curing accelerator | UCAT SA102 | DBU-octylic acid salt | Manufactured by San-Apro Ltd. |

TABLE 5

| | | Curable composition A | Curable composition B | Curable composition C | Curable composition D | Curable composition E | Curable composition F | Curable composition G | Curable composition H |
|---|---|---|---|---|---|---|---|---|---|
| Photocurable compound | TMPTA | 30 | 35 | 30 | 45 | | 30 | | 50 |
| | IRR-214K | 30 | 35 | 45 | 45 | 50 | 30 | | 50 |
| Photo- and thermocurable compound | UVACURE 1561 | 10 | | 5 | 5 | 10 | 10 | | |
| | GMA | | | 5 | | 5 | | | |
| Thermocurable compound | EXA850CRP | 30 | 30 | 15 | 5 | 35 | | 30 | |
| | YDF-170 | | | | | | 30 | 50 | |
| | PETG | | | | | | | 20 | |
| Photopolymerization initiator | IRUGACURE369 | 5 | 5 | 5 | 5 | 5 | 5 | | 5 |
| Thermal curing agent | Thermal curing agent A | 7.5 | 7.5 | 4 | 2 | 8 | 7.5 | 20 | |
| Curing accelerator | UCAT SA102 | 1 | 1 | 1 | 1 | 1 | 1 | 1 | 1 |

Example 11

(1) Film Formation

A catalyst ("Catalyst 44" manufactured by Rohm and Haas) and a copper plating liquid ("CUPOSIT 253" manufactured by Rohm and Haas) were disposed on an FR-4 substrate ("R-1705" manufactured by Panasonic Corporation (0.8 mm thick)), and a copper plating layer to serve as copper wiring was partially formed to give a substrate (copper clad laminate).

In accordance with the method for producing an electronic component according to one embodiment of the present invention mentioned above, the steps shown in FIGS. 1 (a) to (e) were performed (however, the conditions were set as shown below in Table 6) to form a cured product film. The application step, in which the curable composition A was applied while being circulated, and the first light irradiation step were performed 10 times, and then the heating step was performed to form a cured product film, thereby giving a printed wiring board, which is an electronic component. In the application step, the curable composition was applied while being circulated. The application pattern was made to give a 5 cm×5 cm flat film, and 20 films were formed.

(2) Fine Pattern Formation

A catalyst ("Catalyst 44" manufactured by Rohm and Haas) and a copper plating liquid ("CUPOSIT 253" manufactured by Rohm and Haas) were disposed on an FR-4 substrate ("R-1705" manufactured by Panasonic Electric Works Co., Ltd. (0.8 mm thick)), and a copper plating layer to serve as copper wiring was partially formed to give a substrate (copper clad laminate).

In accordance with the method for producing an electronic component according to one embodiment of the present invention mentioned above, the steps shown in FIGS. 1(a) to (e) were performed (however, the conditions were set as shown below in Table 6) to form a cured product film. The application step, in which the curable composition A was applied while being circulated, and the first light irradiation step were performed 10 times, and then the heating step was performed to form a cured product film, thereby giving a printed wiring board, which is an electronic component. In the application step, the curable composition was applied while being circulated. Application was performed in such an application pattern that the line width was 150 μm and the interval between lines was 300 μm.

Examples 12 to 21 and Comparative Examples 5 to 8

Film formation and fine pattern formation were performed in the same manner as in Example 11, except that the kind of curable composition and the production conditions were changed as shown below in Table 6.

(Evaluation)
(1) Evaluation of Substrate after Film Formation (Examination of Discharge Failure)

The films were examined under a stereoscopic microscope ("SMZ-10" manufactured by Nikon Corporation) to examine the escape of liquid.
[Criteria for Film Formation]
　◯: 0/20 patterns had failure.
　Δ: 1 or more and 4 or less/20 patterns had failure.
　X: 5 or more/20 patterns had failure.
(2) Evaluation of Substrate after Fine Pattern Formation (Thick Pattern Formation)

Using an optical microscope (Digital microscope VH-2100, manufactured by Keyence Corp.), the lines and the interval between lines were measured at 30 points (excluding regions having discharge failure).
[Criteria for Fine Pattern Formation (Thick Pattern Formation)]
　◯◯: Linewidth is 150±3 μm.
　◯: Linewidth does not fall under ◯◯ and is 150±50 μm.
　Δ: Linewidth does not fall under ◯◯ or ◯ and is 150±80 μm.
　X: Linewidth does not fall under ◯◯, ◯, or Δ and is 150±120 μm.
　XX: There is no interval between lines.
(3) Evaluation of Adhesion of Cured Product Film on Substrate after Film Formation (Long-Term Reliability: Hot-Cold Cycle Evaluation)

Using a liquid-bath-type thermal shock tester ("TSB-51" manufactured by ESPEC Corporation), the substrates after film formation were subjected to a hot-cold cycle test, in which one cycle includes holding at −50° C. for 5 minutes, then heating to 125° C., holding at 125° C. for 5 minutes, and then cooling to −50° C. The substrates were taken out after 500 cycles.

The substrates were observed under a stereoscopic microscope ("SMZ-10" manufactured by Nikon Corporation) to examine separation.
[Criteria for Adhesion]
　◯: No separation
　Δ: Slight separation (not problematic in use)
　X: Significant separation (problematic in use)
The results are shown in the following Table 6.

TABLE 6

| | Ex. 11 | Ex. 12 | Ex. 13 | Ex. 14 | Ex. 15 | Ex. 16 | Ex. 17 | Ex. 18 | Ex. 19 |
|---|---|---|---|---|---|---|---|---|---|
| Curable composition | A | A | A | A | A | A | B | C | D |
| Viscosity (mPa · s) | 38 | 38 | 38 | 868 | 510 | 13 | 74 | 50 | 16 |
| Ink jet head | Piezoelectric head | | | | | | | | |
| Circulation temperature | 80° C. | 80° C. | 80° C. | 30° C. | 40° C. | 110° C. | 80° C. | 80° C. | 80° C. |
| Circulation velocity*1 | 30 ml/min | 30 ml/min | 30 ml/min | 30 ml/min | 30 ml/min | 30 ml/min | 30 ml/min | 30 ml/min | 30 ml/min |
| Buffer tank | Present | Present | Absent | Present | Present | Present | Present | Present | Present |
| First light irradiation (mJ/cm$^2$)*2 | 50 | 50 | 50 | 50 | 50 | 50 | 50 | 50 | 50 |
| Second light irradiation (mJ/cm$^2$)*3 | Absent | 2000 | 2000 | 2000 | 2000 | 2000 | 2000 | 2000 | 2000 |
| Heating | 170° C. × 3 hr | | | | | | | | |
| (1) Film formation | ◯ | ◯ | ◯ | ◯ | ◯ | ◯ | ◯ | ◯ | ◯ |
| (2) Fine pattern formation | ◯ | ◯◯ | ◯ | ◯ | ◯◯ | ◯ | ◯◯ | ◯◯ | ◯◯ |
| (3) Adhesion | ◯ | ◯ | ◯ | ◯ | ◯ | ◯ | Δ | ◯ | ◯ |

TABLE 6-continued

|  | Ex. 20 | Ex. 21 | Comp. Ex. 5 | Comp. Ex. 6 | Comp. Ex. 7 | Comp. Ex. 8 |
|---|---|---|---|---|---|---|
| Curable composition | E | F | A | A | G | H |
| Viscosity (mPa · s) | 253 | 28 | 38 | 38 | 482 | 15 |
| Ink jet head | | | Piezoelectric head | | | |
| Circulation temperature | 80° C. | 80° C. | 80° C.*4 | 80° C.*4 | 80° C. | 80° C. |
| Circulation velocity*1 | 30 ml/min | 30 ml/min | Not circulated | Not circulated | 30 ml/min | 30 ml/min |
| Buffer tank | Present | Present | Absent | Absent | Present | Present |
| First light irradiation (mJ/cm$^2$)*2 | 50 | 50 | 50 | 50 | Absent | 50 |
| Second light irradiation (mJ/cm$^2$)*3 | 2000 | 2000 | Absent | 2000 | Absent | 2000 |
| Heating | | | 170° C. × 3 hr | | | Absent |
| (1) Film formation | ○ | ○ | x | x | ○ | ○ |
| (2) Fine pattern formation | ○○ | ○○ | x | Δ | xx | ○○ |
| (3) Adhesion | ○ | ○ | ○ | ○ | ○ | x |

*1Circulated using a pump
*2Irradiated using a UV-LED having an irradiation intensity of 50 mW/cm$^2$ at 365 nm
*3Irradiated using an ultrahigh-pressure mercury lamp having an irradiation intensity of 100 mW/cm$^2$ at 365 nm
*4Heated only at the head part

EXPLANATION OF SYMBOLS

1 . . . Electronic component
2 . . . Electronic component body
3 . . . Multilayer cured product film (after heating)
3A, 3B, 3C . . . Cured product film (after heating)
11 11X . . . Ink jet device
12 . . . Curable composition
12A, 12B, 12C . . . Precured product film irradiated with light from the first light irradiation part
12X . . . Multilayer precured product film
12Y . . . Multilayer precured product film irradiated with light from the second light irradiation part
13 . . . First light irradiation part
14 . . . Second light irradiation part
21 . . . Ink tank
22 . . . Discharge part
23, 23X . . . Circulation flow path part
23A . . . Buffer tank
23B . . . Pump
31 . . . Electronic component
32 . . . Cured product film

The invention claimed is:

1. A method for producing a cured product film, comprising:
an application step in which a curable composition that is photocurable and thermocurable and also is in liquid form is applied using an ink jet device;
a first light irradiation step in which, after the application step, the curable composition is irradiated with light from a first light irradiation part to allow the curing of the curable composition to proceed, thereby forming a precured product film; and
a heating step in which, after the first light irradiation step, the precured product film irradiated with light is heated to cure the precured product film irradiated with light, thereby forming a cured product film,
the ink jet device including:
an ink tank to store the curable composition;
a discharge part that is connected to the ink tank and discharges the curable composition;
a circulation flow path part that is connected to the discharge part at one end and connected to the ink tank part at the other end, through which the curable composition flows; and
a heating heater,
the circulation flow path part including, in the circulation flow path part, a pump to transfer the curable composition and a buffer tank to temporarily store the curable composition,
wherein the buffer tank is arranged between the pump and the discharge part and acts as a damper to suppress pressure fluctuation of the pump, and wherein a cross-sectional area of the buffer tank is greater than both a cross-sectional area of a portion of the circulation flow path part immediately upstream of the buffer tank and a cross-sectional area of a portion of the circulation flow path part immediately downstream of the buffer tank,
the heating heater is introduced in the ink tank or is in the circulation flow path part, and
the application step is such that, in the ink jet device, the curable composition is moved from the ink tank to the discharge part, and then the curable composition that has not been discharged from the discharge part is moved through the circulation flow path part to the ink tank, whereby the curable composition is applied while being circulated, and the temperature of the curable composition during circulation is 40° C. or more and 100° C. or less.

2. The method for producing a cured product film according to claim 1, further comprising, after the first light irradiation step and before the heating step, a second light irradiation step in which the precured product film irradiated with light from the first light irradiation part is irradiated with light from a second light irradiation part that is different from the first light irradiation part to allow the curing of the precured product film to further proceed.

3. The method for producing a cured product film according to claim 1, further comprising, after the first light irradiation step and before the heating step, a multilayering step in which the application step and the first light irradiation step are performed on the precured product film after the first light irradiation step to form an additional precured product film on the precured product film, thereby forming a multilayer precured product film.

4. The method for producing a cured product film according to claim 3, further comprising, after the multilayering step and before the heating step, a second light irradiation step in which the multilayer precured product film is irradiated with light from a second light irradiation part that is different from the first light irradiation part to allow the curing of the multilayer precured product film to further proceed.

5. The method for producing a cured product film according to claim 1, wherein
the ink jet device is an ink jet device using a piezoelectric ink jet head, and,
in the application step, the curable composition is applied by the action of a piezo element.

6. The method for producing a cured product film according to claim 1, wherein the viscosity of the curable composition during discharge is 3 mPa·s or more and 1500 mPa·s or less.

7. The method for producing a cured product film according to claim 1, wherein the curable composition contains a photocurable compound, a thermocurable compound, a photopolymerization initiator, and a thermal curing agent.

8. The method for producing a cured product film according to claim 7, wherein the curable composition contains the photocurable compound, a photo- and thermocurable compound, the thermocurable compound, the photopolymerization initiator, and the thermal curing agent.

9. The method for producing a cured product film according to claim 8, wherein
the photocurable compound has a (meth)acryloyl group,
the photo- and thermocurable compound has a (meth)acryloyl group and a cyclic ether group, and
the thermocurable compound has a cyclic ether group.

10. The method for producing a cured product film according to claim 7, wherein
the curable composition contains a photo- and thermocurable compound, and
the total of the photocurable compound content and the photo- and thermocurable compound content is 40 wt % or more and 90 wt % or less based on 100 wt % of the curable composition.

11. A method for producing an electronic component, comprising a step of forming a cured product film on an electronic component body by the method for producing a cured product film according to claim 1, thereby producing an electronic component including an electronic component body and the cured product film on the electronic component body.

12. The method for producing a cured product film according to claim 7, wherein the thermocurable compound content is 3 wt % or more and 60 wt % or less based on 100 wt % of the curable composition.

13. The method for producing a cured product film according to claim 7, wherein the photopolymerization initiator content is 0.1 wt % or more and 10 wt % or less based on 100 wt % of the curable composition.

14. The method for producing a cured product film according to claim 7, wherein the curable composition further contains a curing accelerator, and the curing accelerator content is 0.01 wt % or more and 10 wt % or less based on 100 wt % of the curable composition.

15. The method for producing a cured product film according to claim 2, wherein an irradiation intensity of the light in mW/cm$^2$ unit from the second light irradiation part is higher than an irradiation intensity of the light in mW/cm$^2$ unit from the first light irradiation part.

16. The method for producing a cured product film according to claim 2, wherein an irradiation amount of the light in mJ/cm$^2$ unit from the second light irradiation part is larger than an irradiation amount of the light in mJ/cm$^2$ unit from the first light irradiation part.

17. The method for producing a cured product film according to claim 7, wherein the curable composition contains, as the photocurable compounds, a monofunctional compound having one (meth)acryloyl group and a multifunctional compound having two or more (meth)acryloyl groups.

\* \* \* \* \*